(12) United States Patent
Haase et al.

(10) Patent No.: US 9,431,584 B2
(45) Date of Patent: Aug. 30, 2016

(54) LIGHT CONVERTING AND EMITTING DEVICE WITH SUPPRESSED DARK-LINE DEFECTS

(75) Inventors: Michael A. Haase, St. Paul, MN (US); Thomas J. Miller, Woodbury, MN (US); Terry L. Smith, Roseville, MN (US); Xiaoguang Sun, Woodbury, MN (US); Junqing Xie, Woodbury, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 214 days.

(21) Appl. No.: 13/698,384

(22) PCT Filed: May 31, 2011

(86) PCT No.: PCT/US2011/038562
§ 371 (c)(1),
(2), (4) Date: Nov. 16, 2012

(87) PCT Pub. No.: WO2011/153141
PCT Pub. Date: Dec. 8, 2011

(65) Prior Publication Data
US 2013/0069038 A1    Mar. 21, 2013

Related U.S. Application Data

(60) Provisional application No. 61/351,072, filed on Jun. 3, 2010.

(51) Int. Cl.
*H01L 33/50* (2010.01)
*H01L 33/08* (2010.01)
*H01L 21/02* (2006.01)

(52) U.S. Cl.
CPC ............ *H01L 33/504* (2013.01); *H01L 33/08* (2013.01); *H01L 21/0256* (2013.01); *H01L 21/02477* (2013.01); *H01L 21/02568* (2013.01); *H01L 33/50* (2013.01)

(58) Field of Classification Search
CPC ..... H01L 33/28; H01L 33/285; H01L 33/32; H01L 33/06; H01L 33/007; H01L 33/08; B82Y 20/00
USPC .......................................................... 257/13
See application file for complete search history.

(56) References Cited

U.S. PATENT DOCUMENTS 5,268,918 A * 12/1993 Akimoto et al. ................ 257/13
2006/0102916 A1* 5/2006 Sun et al. ........................ 257/98

(Continued)

FOREIGN PATENT DOCUMENTS

WO    WO 2006/062560 A1    6/2006
WO    WO 2010/027580 A2    3/2010

(Continued)

OTHER PUBLICATIONS

Fischer, F., et al., *Reduction of the Extended Defect Density in Molecular Beam Epitaxy Grown ZnSe based II-VI heterostructures by the use of a BeTe Buffer Layer*, Journal of Applied Physics, American Institute of Physics, vol. 84, No. 3, pp. 1650-1654, Aug. 1, 1998.

(Continued)

*Primary Examiner* — Allen Parker
*Assistant Examiner* — Long Le
(74) *Attorney, Agent, or Firm* — Yufeng Dong

(57) ABSTRACT

Light emitting systems are described. Particularly, light emitting systems and light converting components utilized within these systems are described. The light emitting system and components are formed such that dark-line defects do not interfere with the light emitting system efficiency.

17 Claims, 8 Drawing Sheets

(56) References Cited

U.S. PATENT DOCUMENTS

| | | | |
|---|---|---|---|
| 2007/0284565 A1* | 12/2007 | Leatherdale et al. | 257/13 |
| 2007/0284603 A1 | 12/2007 | Haase | |
| 2008/0121928 A1* | 5/2008 | Niigaki et al. | 257/184 |
| 2008/0142816 A1 | 6/2008 | Bierhuizen | |
| 2009/0072263 A1 | 3/2009 | Paolini | |
| 2010/0032008 A1* | 2/2010 | Adekore | 136/255 |
| 2011/0256648 A1* | 10/2011 | Kelley et al. | 438/29 |

FOREIGN PATENT DOCUMENTS

| | | |
|---|---|---|
| WO | WO 2011/153034 A2 | 12/2011 |
| WO | WO 2011/153153 A2 | 12/2011 |

OTHER PUBLICATIONS

Hornstra, J. et al., *Determination of the Lattice Constant of Epitaxial Layers of III-V Compounds*, Journal of Crystal Growth, vol. 44, pp. 513-517 (1978).

PCT/US2011/038562 International Search Report dated Aug. 12, 2011.

PCT/US2011/038562 Written Opinion of the International Searching Authority dated Dec. 8, 2011.

U.S. Appl. No. 61/351,072 to Haase et al., filed Jun. 30, 2010, entitled Light Converting and Emitting Device with Suppressed Dark-Line Defects.

* cited by examiner

LIGHT CONVERTING AND EMITTING DEVICE WITH SUPPRESSED DARK-LINE DEFECTS

FIELD

This invention generally relates to light emitting systems. Particularly, this invention relates to light emitting systems and light converting components utilized within these systems that are formed such that dark-line defects do not interfere with the light emitting system efficiency.

BACKGROUND

Light emitting devices are used in many different applications, including projection display systems, backlights for liquid crystal displays and the like. Projection systems often use one or more white light sources, such as high pressure mercury lamps. The white light beam is usually split into three primary colors, red, green and blue, and is directed to respective image forming spatial light modulators to produce an image for each primary color. The resulting primary-color image beams are combined and projected onto a projection screen for viewing.

More recently, light emitting diodes (LEDs) have been considered as an increasingly popular alternative to white light sources. LEDs have the potential to provide the brightness and operational lifetime that would compete with conventional light sources. A promising approach to LEDs for such applications is color converted LED technology, in which semiconductor color converting layers are used to efficiently convert short wavelength light into light of longer wavelengths. However, certain defects associated with color converting layers may result in both a reduction of performance and of lifetime. The present application seeks to address these defects.

SUMMARY

In one aspect, the present description relates to a wavelength converting stack of semiconductor layers. The stack includes at least one absorber layer that absorbs light at wavelength $\lambda_1$ and not light at a longer wavelength $\lambda_2$. The stack also includes at least one potential well layer that converts at least a portion of light at wavelength $\lambda_1$ into light at wavelength $\lambda_2$. Further, the stack includes a window layer that is substantially transparent to $\lambda_1$, and the window layer is made up, in part, of beryllium.

In another aspect, the present description relates to a light emitting system. The light emitting system includes an LED that emits light at a first wavelength, and a light converting semiconductor element. The light converting semiconductor element is capable of receiving light of the first wavelength from the LED and converting at least part of that light into light of a second wavelength. The light converting semiconductor element also is made up, in part, of beryllium.

In a third aspect, the present description relates to a film stack. The film stack includes a substrate and an epitaxial layer grown on the substrate. The substrate is made up of InP and has a lattice constant $a_0$. The epitaxial layer has a lattice constant $a$, and is made up of $Cd(x)Mg(y)Zn(1-x-y)Se$, where $y>0.20$. Further, the epitaxial layer is in biaxial tensile strain with the substrate at room temperature, and $-0.18\% < (a-a_0)/a_0 < -0.02\%$.

BRIEF DESCRIPTION OF THE DRAWINGS

FIG. 1b is an energy band diagram of the wavelength-converting stack of FIG. 1a.

DETAILED DESCRIPTION

The present description relates to LED systems used for a number of applications including illumination systems. In a great deal of such systems, it may be more efficient to provide an electrically-driven LED that emits light of a pump light wavelength, and convert that light to the desired output wavelength by means of a converting layer, such as a semiconductor potential well, than it is to generate the desired output wavelength directly with an electrically-driven LED. In other systems, a variety of colors may be desired, for, e.g., color mixing. For instance, it may be desirable to generate a blue pump light and allow for conversion of some of this light from blue to red, and some of this light from blue to green. The resulting mixed light may then be a white or near-white light that is highly suitable for a number of illumination applications. Unfortunately, in applications that seek to utilize an LED and color conversion layers, certain defects may be associated with the system.

A multilayered semiconductor wavelength converter stack that may be used with an LED device typically employs multilayered quantum well structures based on II-VI semiconductor materials, for example various metal alloy selenides such as CdMgZnSe. Another appropriate semiconductor material may include Cd, Mg, Zn, Se and Te. In such multilayered wavelength converters, the semiconductor wavelength converter is structured so that the band gap in portions of the structure is such that at least some of the pump light emitted by the LED is absorbed. The charge carriers generated by absorption of the pump light diffuse into quantum well layers engineered to have a smaller band gap than the absorbing regions, where the carriers recombine and generate light at a longer wavelength. This description is not intended to limit the types of semiconductor materials or the multilayered structure of the wavelength converter.

Figure 2:
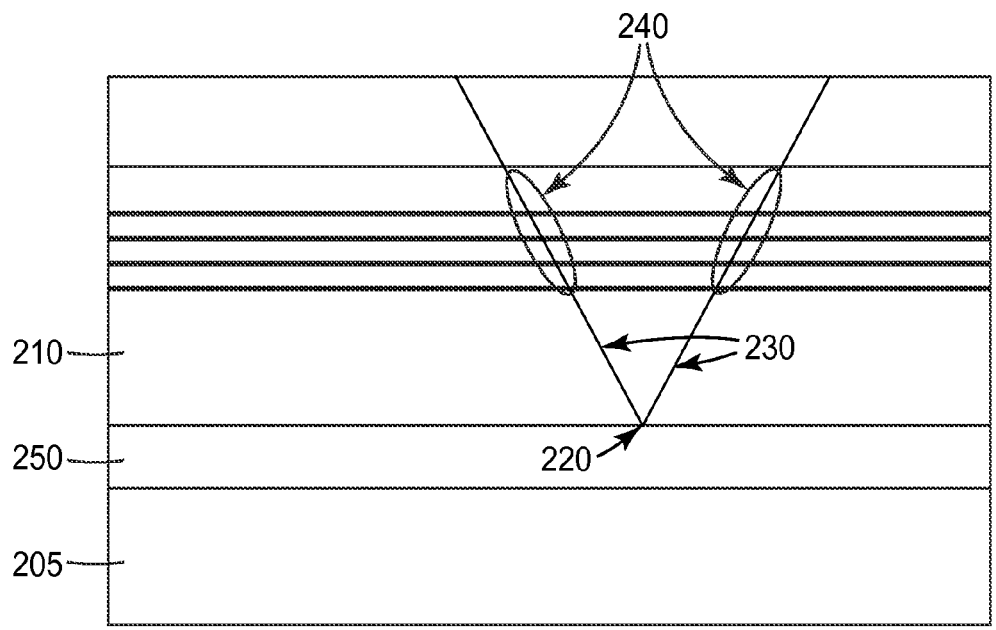
FIG. 2 is a cross-sectional view of a wavelength converting stack of semiconductor layers.
Figure 4:
FIG. 4 is a photoluminescent microscopy image of a light emitting system with dark spot defects.
Figure 5:
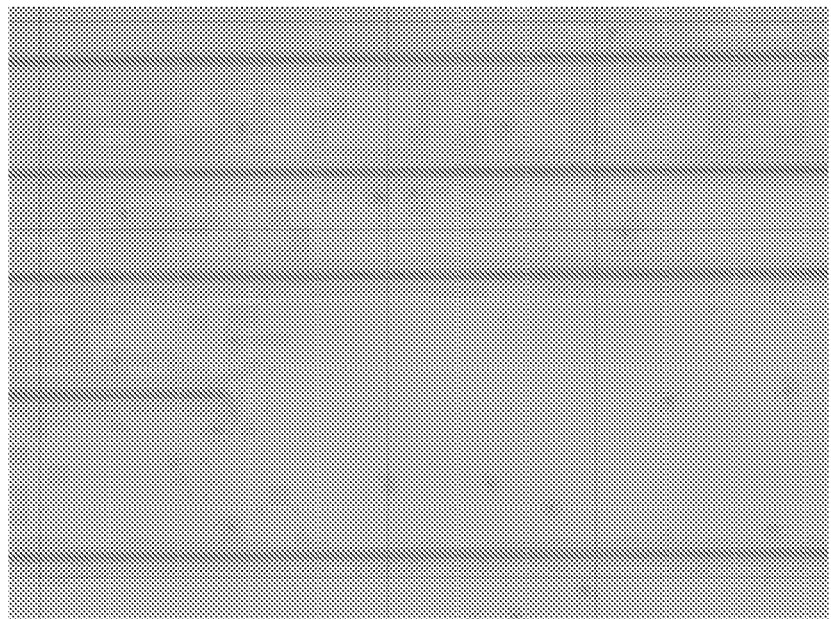
FIG. 5 is a photoluminescent microscopy image of a light emitting system with dark line defects.

One common defect associated with some of the light emitting systems described above is what may be termed "dark line defects." These dark line defects create serious issues of rapid efficiency degradation after aging under high temperature and high photon flux. One example of dark line defects is illustrated in FIG. 5. Dark line defects may generally be understood as associated with growing wavelength converter layers on substrates (e.g. epitaxially growing II-VI semiconductor layers on a III-V material substrate, such as InP). Better understanding of this may be gained by reference to FIG. 2. When such epitaxial growth of converter layer 210 occurs, stacking faults 220 generally originate at the interface between the converter layer 210 and the optional buffer layer 250 or the substrate 205. These stacking faults are bounded by dislocations 230. Some of the dislocations pass through the converter layer and adjacent layers and provide "dark spots" 240 where non-radiative recombination occurs. An example of dark spots is illustrated in FIG. 4.

Figure 3:
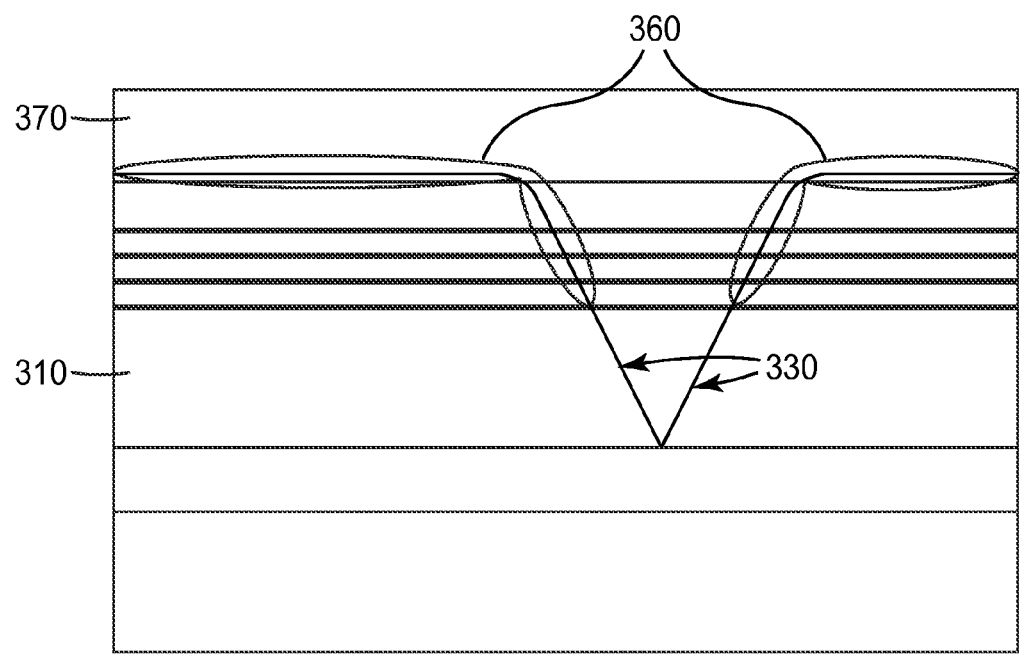
FIG. 3 is a cross sectional view of a wavelength converting stack of semiconductor layers.

In other situations dislocations may bend and lie parallel to the layers. FIG. 3 schematically illustrates this effect. Here, dislocations 330 bend horizontally as the converter layers 310 are grown and dark recombination centers are located along the horizontal lines 360. In this, a typical case, the dislocations 330 run horizontally near the bottom of the window layer 370 and bound extended stacking faults in the window layer. These "dark lines" 360 may appear for lengths of millimeters across the surface of converter layer 310. The dark line defects rapidly degrade efficiency of color converter layers, and thus associated light emitting systems, by creating large regions of dark recombination that can grow in size during operation. These large regions of dark recombination account for why dark lines are a much bigger problem than dark spots. An example of dark-line defects as seen in photoluminescence imaging is illustrated in FIG. 5.

The present description provides solutions to the problem of dark-line defects in LEDs utilizing color converter layers, and also light emitting systems that utilize such elements. Therefore, in one aspect, the present description provides a means for producing LEDs with wavelength converters that have longer lifetime and better performance.

Figure 1A:
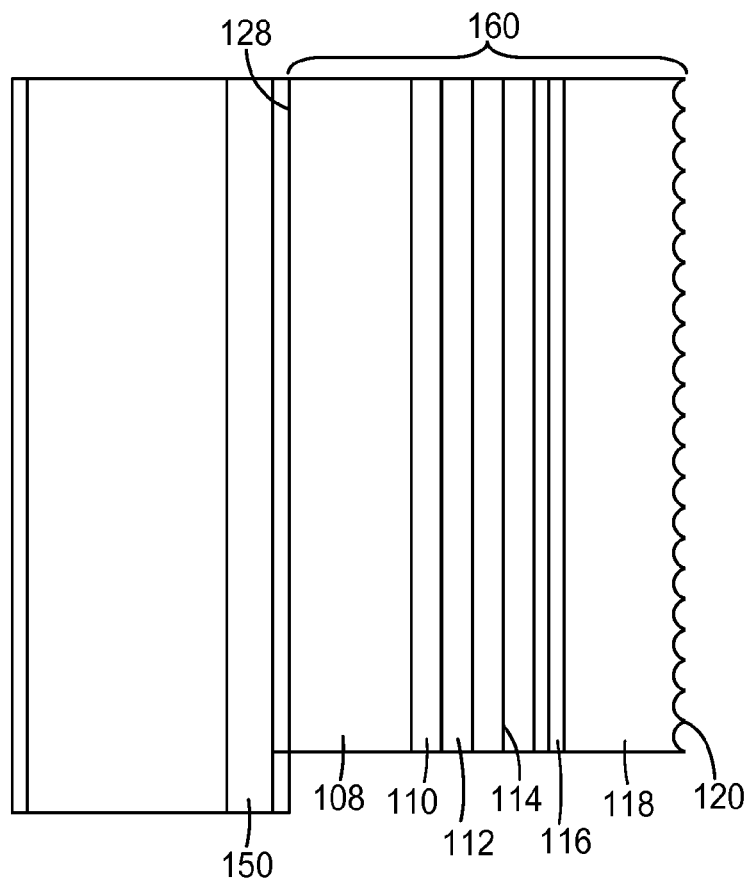
FIG. 1a is a side view of a light emitting system including a wavelength-converting stack of semiconductor layers.
Figure 1B:
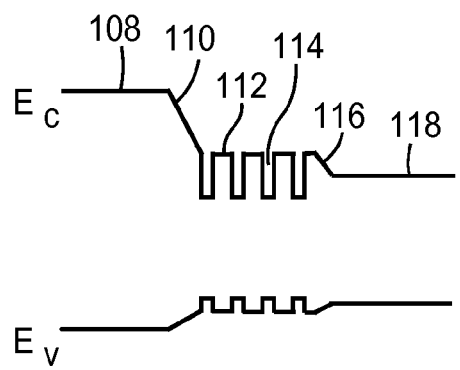
Figure 1C:
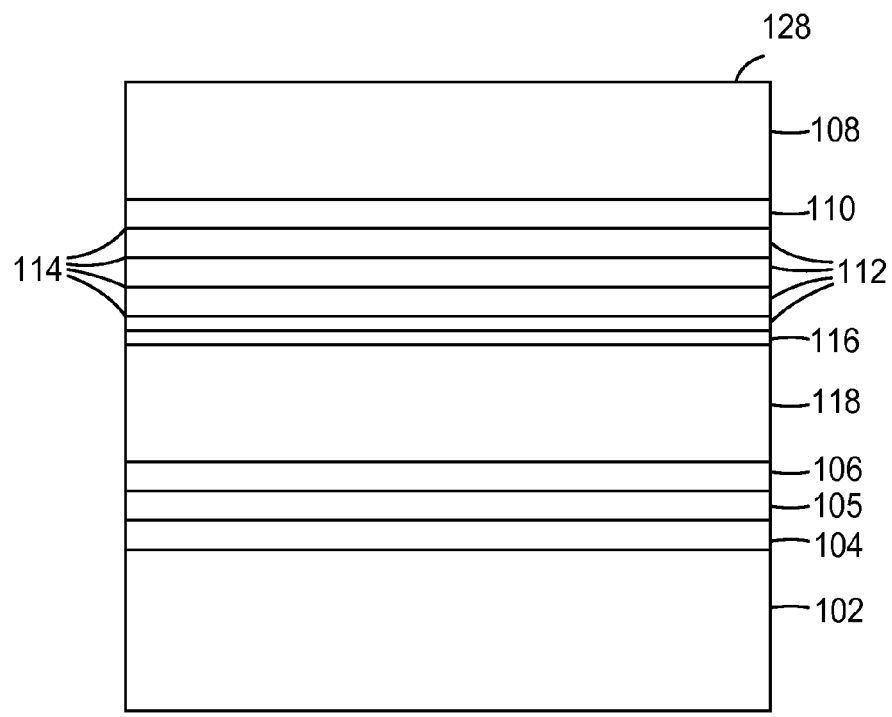
FIG. 1c is a side view of a wavelength-converting stack of semiconductor layers grown on a substrate.

The present invention may be better understood by reference to a light emitting system with a wavelength converting stack of materials, and to the wavelength converting stack itself. A side-view of such a construction is shown in FIG. 1a, and an energy band diagram of the wavelength converting stack is shown in FIG. 1b. FIG. 1c illustrates the same wavelength converting stack while still on the substrate on which it was grown. As a general overview, light of a first wavelength $\lambda_1$ generated in LED 150 travels to and enters into the wavelength converting stack 160 via window layer 108. In FIG. 1c, the wavelength converting stack may be understood as the series of layers that are epitaxially grown on top of substrate 102 and optional buffer layers 104, 105, 106. Thus, in FIG. 1c, the wavelength converting stack may be understood as layers 108 through 118 or layers 108 through 104.

Once light travels through the window layer 108, and optional graded window layer 110, light then enters into a series of absorbing layers 112 and potential wells 114. A graded layer is one whose composition changes from one side to the other so as to provide a smooth transition in band gap between adjacent layers. At least some of the light of the first wavelength $\lambda_1$ is absorbed by absorbing layers 112 and photo-generated electron-hole pairs are created. These charge carriers then diffuse into potential wells 114 where at least some recombine to generate light of the second wavelength $\lambda_2$. Some light of the second wavelength then travels through optional filtering graded layer 116.

In addition, light may travel through a light filtering element 118, such as a cyan blocker. A light filtering element may be understood as a layer that serves to absorb a substantial portion of the light supplied by the pump light source at wavelengths near $\lambda_1$ that is not absorbed by the absorbing layer(s). The light filtering element may also efficiently transmit the re-emitted light of wavelength $\lambda_2$ originating from the potential well(s) 114. The light filtering element may be sufficiently thick so as to prevent diffusion of photo-generated carriers from the absorber layers to the surface of the converter stack. On the opposite side of the wavelength converting stack 160 from the window layer 108, light may travel through extraction features 120. The extraction features 120 help overcome total internal reflection by scattering light out of the wavelength converting stack 160, thereby improving efficiency. Layer properties of wavelength converting stack 160 may be chosen based on the desired color balance of the pump light $\lambda_1$ and the converted light, e.g. light of wavelength $\lambda_2$. The substrate 102 and buffer layers 104, 105, 106 may be removed by an appropriate means, such as etching, after the wavelength converter layers 160 are grown upon them.

The light emitting system 100 includes both an LED 150, and a wavelength converter stack 160. The LED 150 may be made up of any suitable material, such as a III-V semiconductor material, for example, GaN, or AlGaInN. Typically the LED will emit light of a first wavelength $\lambda_1$, and this light may be understood as "pump light." At least some of the pump light will ultimately be converted to at least a second wavelength $\lambda_2$, and potentially third and fourth wavelengths, etc. In at least one embodiment, $\lambda_1$ is a blue wavelength. $\lambda_2$ may be, for example, a red or a green wavelength. In some cases, where $\lambda_2$ is a red wavelength, a third converted wavelength $\lambda_3$ from the potential wells that is a green wavelength will be contemplated.

The layers of the wavelength converter stack 160 are typically grown on a substrate 102. The layers are grown individually on top of one another using conventional epitaxial growth techniques, such as molecular beam epitaxy (MBE). One particularly useful material for the substrate 102 is InP. Between the grown layers and the InP substrate may be a buffer layer 104. The buffer layer 104 may be any suitable material, but preferably will be chosen based upon its function. Namely, the buffer layer 104 will be a material that may closely lattice-match with the InP substrate for purposes of aiding growth on the substrate. In one embodiment, the buffer layer may be a III-V buffer layer such as InP, GaInAs or GaAsSb. Optionally, an additional buffer layer 105 may be grown, such as a II-VI buffer layer comprising CdZnSe, BeCdSe, ZnSeTe or BeZnTe. Optionally, further graded buffer layer 106 may be grown, such as a layer including CdZnMgSe with varying composition. Substrate 102 and buffer layers 104, 105, 106 serve as a base upon which to build the epitaxial layers that make up the wavelength converting stack 160. They may, therefore, be desirably etched away from the stack after growth to avoid any adverse performance effects, such as unwanted absorption of the light generated by the potential wells. However, during this process of the stack being grown on the substrate and buffer layers, stacking faults and associated dislocations may form, as discussed above. The manner of avoiding these defects is discussed further below.

The window layer 108 is the layer that will be located most proximate an LED 150, and in at least some embodiments, be directly bonded to the LED 150. Window layers are provided to provide high energy band barriers so that free carriers that are photo-generated in an absorbing layer and/or potential well have no, or very little, chance to diffuse to a free or an external surface of the stack 160. For example, window layer 108 is designed primarily to prevent carriers generated in first absorber layers 112 from migrating to surface 128, where they could recombine non-radiatively. In some cases, window layer 108 has a band gap energy that is greater than the energy of a photon emitted by the LED 150.

Generally, window 108 is substantially transparent to light from the LED (light of the first wavelength $\lambda_1$), and also transparent to light re-emitted by potential wells 114 of the second wavelength $\lambda_2$. The window layer may be made of a suitable semiconductor material. In at least one embodiment, the material will be made up in part of II-VI semiconductor materials, such as Cd, Mg, Zn and Se. Other materials may be added, as discussed below.

The wavelength converting stack may also include a number of potential wells 114. Element 114 may be understood as including a potential well, a quantum well, or a plurality of each or any combination thereof. Inorganic semiconductor potential and quantum wells typically have increased light conversion efficiencies compared to, for example, organic materials, and are more reliable by being less susceptible to environmental elements such as moisture. Furthermore, inorganic potential and quantum wells tend to have narrower output spectra than organic materials or conventional phosphors, resulting in, for example, improved color gamut.

As used herein, potential well means semiconductor layer (s) in a multilayer semiconductor structure designed to confine a carrier in one dimension only, where the semiconductor layer(s) has a lower conduction band energy than the surrounding layers and/or a higher valence band energy than the surrounding layers. Quantum well generally means a potential well which is sufficiently thin that quantization effects increase the energy for electron-hole pair recombination in the well. A quantum well typically has a thickness of about 100 nm or less, or about 10 nm or less.

In some cases, a potential or quantum well 114 includes a II-VI semiconductor potential or quantum well that has a transition energy $E_{qw}$ that is smaller than the energy $hv_1$ of a photon emitted by the LED 150. In general, the transition energy of a potential or quantum well 114 is substantially equal to the energy $hv_2$ of a photon that is generated by recombination of an electron-hole pair in the potential or quantum well. In some cases, potential well 114 can include CdMgZnSe alloys having compounds ZnSe, CdSe, and MgSe as the three constituents of the alloy.

As noted, light absorbing layers 112 absorb at least a portion of light of the first wavelength $\lambda_1$. As a result of this absorption, the absorbing layers 112 create photo-generated electron-hole pairs. The carriers diffuse from the light absorbing layers 112 into the potential well layers 114. In the potential well layers 114, the carriers recombine and emit light at the second wavelength $\lambda_2$. In order to provide the most efficient conversion of light, it is therefore desirable for the absorbing layers 112 to be sufficiently thin and in close proximity to the potential well layers 114, as shown in FIG. 1. This allows for efficient collection of free carriers in the wells, minimizing problems such as non-radiative recombination within the absorber layer 112. Absorbing layers may be made of a semiconductor material, in particular a II-VI semiconductor material. In one embodiment, the absorbing layers are comprised of a composition of Cd, Mg, Zn and Se.

In some embodiments, dark line defects form as a result of misfit strain in the epitaxial layers of the wavelength converting stack as grown on the substrate. In some semiconductors, excessive misfit strain in epitaxial layers is relaxed by the formation of extended stacking faults. One well known method of reducing or eliminating such misfit defects is to decrease the thickness of the epitaxial layers. In order for stacking faults to form due of misfit strain in a converter layer, the thickness of the layer must exceed a critical thickness. This critical thickness depends on the strain in the converter layer and the material composition of the layer. In particular, in the CdMgZnSe materials commonly used in wavelength converters, the amount of strain required to form stacking faults decreases significantly as the Mg concentration is increased. This phenomenon may be interpreted as a reduction in the energy required to form a stacking fault with increasing Mg concentration in CdMgZnSe. Unfortunately, in a great number of applications, it is not possible to use or construct a layer thin enough to avoid dark line defects. For example, a CdMgZnSe epitaxial layer with very high Mg will exhibit an extremely small critical thickness, even for a small amount of strain. At a given Mg level, such a thickness may not be thick enough to serve its desired function. Given the necessity of providing sufficient thickness for the various layers of the wavelength converting stack to perform their functions without the formation of dark line defects, it is highly desirable to develop designs and methods to reduce dark-line defects that can be used instead of decreasing layer thickness, or at least used in combination with this.

In one particular embodiment, a first manner of reducing dark-line defects is contemplated. As illustrated and discussed below with respect to FIG. 8, strain in the epitaxial layers has a big effect on the formation of dark line defects. Generally, CdMgZnSe epitaxial layers are grown at a substrate temperature of approximately 300° C. In a number of embodiments, dark line defects can be significantly reduced or even eliminated where the epitaxial converter layer is grown closely lattice-matched to the substrates upon which they grow at growth temperature (e.g. 300° C.). In other words, the epitaxial layer and substrate should have the same lattice constant at the elevated temperature. The lattice constant of a structure refers to size of the unit cells in the crystal lattice.

Given the difficulty of measuring lattice constants and manipulating layers at growth temperature, it is important to understand how exactly the two layers, and their respectively lattice constants, expand with heat. One index that provides a measure of the degree of expansion is the coefficient of thermal expansion, $\alpha$. In a good number of contemplated embodiments, the epitaxially grown converter layer will have a higher thermal expansion coefficient than the substrate upon which it is grown. Therefore, in such a situation, it is preferred that the epitaxially grown converter layer be in a certain range of tensile strain after cooling to room temperature. If the converter layer is in compressive strain on the substrate at room temperature, the lattice-mismatch will be even greater at the growth temperature. If the converter layer is in too much tensile strain at room temperature, it would still be in tensile strain at the growth temperature, and dark-line defects could occur. In one example, the epitaxial converter layer may be CdMgZnSe that is grown on an InP substrate. The preferable range of tensile strain may be characterized by a splitting of the (400) Bragg reflection peaks of the layer and the substrate between 0 (lattice matched) and 500 arc seconds (high tensile strain) when measured at room temperature using Cu K$\alpha$ X-rays.

However, in general it is difficult to gauge the accuracy of lattice match required at growth temperature to prevent misfit dislocations, because it is a function of the concentration of magnesium that is present in the CdMgZnSe alloy. Given the difficulty of measuring material properties of a layer at growth temperature, as well as the potential variation of thermal expansion for different magnesium levels, it would be highly beneficial to understand the acceptable range of lattice-mismatch at room temperature of an epitaxial layer with a given level of magnesium. The present description teaches such combinations.

Figure 8:
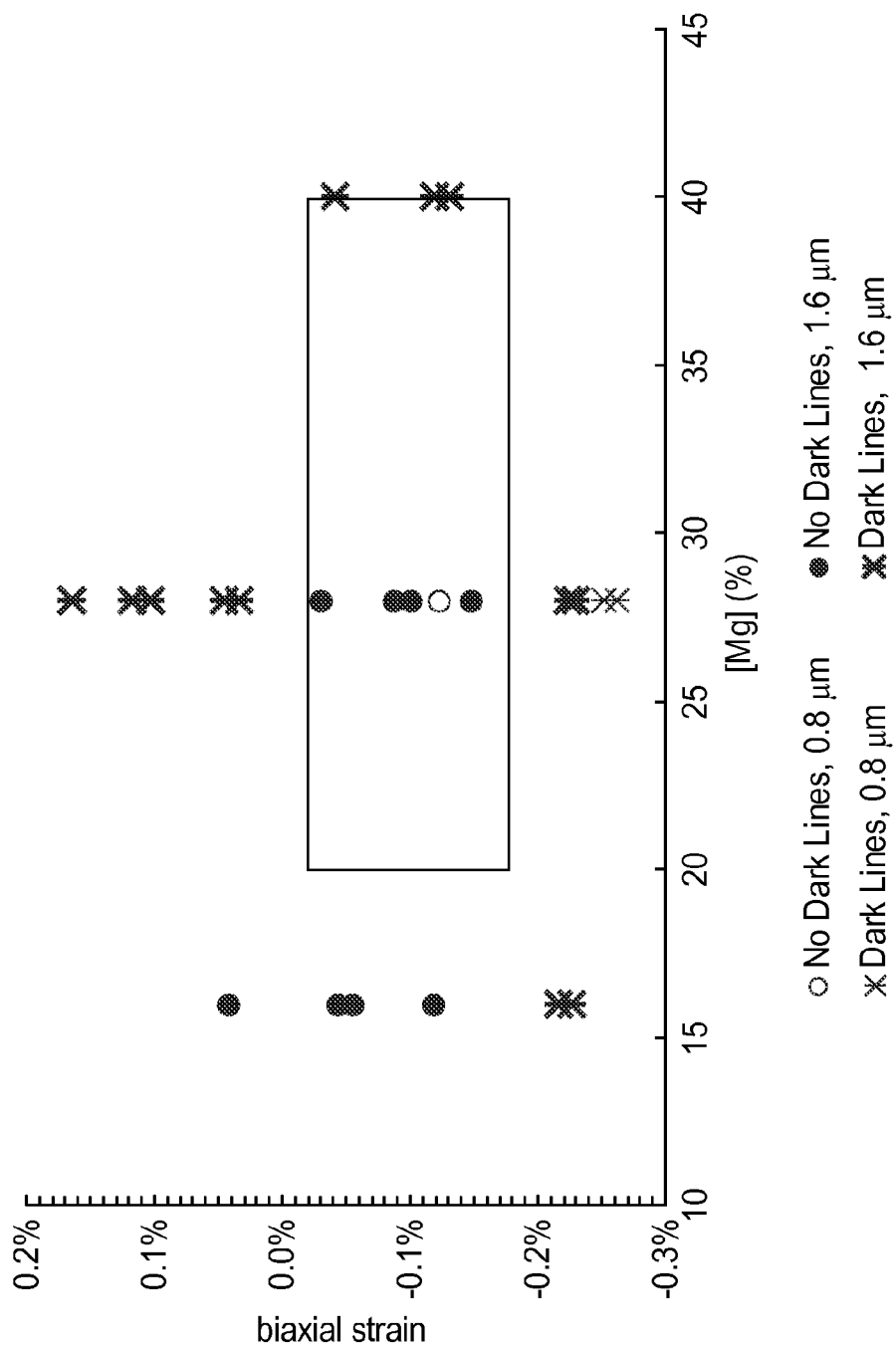
FIG. 8 is a graph illustrating the experimentally-observed incidence of dark line defects versus biaxial strain, magnesium percentage and thickness of a wavelength-converting stack.

In some embodiments, a preferred combination of Cd, Mg, Zn, and Se levels in a layer is contemplated that creates a preferred lattice mismatch with the InP substrate at room temperature (or a preferred biaxial tensile strain), such that the there is a lattice match at with the substrate at growth temperature. One such embodiment includes a film stack made up of a layer of Cd(x)Mg(y)Zn(1-x-y)Se epitaxially grown on InP substrate. In this example, y may be greater than or equal to 0.20. The epitaxial layer is in biaxial tensile strain at temperature such that the relaxed lattice constant "a" of the epitaxial layer is smaller than the lattice constant "$a_0$" of InP as described by: $-0.18\% < (a-a_0)/a_0 < -0.02\%$. In at least one embodiment, the value of the Mg composition "y" may be less than 0.40 and greater than or equal to 0.20. The relative amount of Cd, "x" may be determined from the relaxed lattice constant, "a" using Vegard's Law and the known lattice constants of CdSe, MgSe, and ZnSe. The level of Zn is determined according to the levels of Cd and Mg. The level of Se is equal to the sum of the amount of Cd, Mg and Zn to achieve a stoichiometric film. The relaxed lattice constant "a" of an epitaxial layer may be calculated from X-ray measurements by well-known techniques (J. Hornstra and W. J. Bartels, J. Crystal Growth, Vol. 44, pp 513-517 (1978)). This range of acceptable Mg composition and strain is illustrated by the boxed region in FIG. 8. FIG. 8 summarizes the presence or absence of dark-line defects in 23 different CdMgZnSe epitaxial layers grown with various thicknesses, Mg compositions, and levels of room-temperature misfit strain. For Mg compositions less than 0.2, the conventional approach of achieving near-lattice matched condition at room temperature is sufficient. However, for Mg concentrations greater than or equal to 0.2, because of the reduced stacking fault formation energy in these alloys, the misfit strain must be controlled to within a tighter range and the layer must be in biaxial tensile strain at room temperature, as indicated by the boxed region.

In another particular embodiment, a different manner of reducing dark-line defects is contemplated. Specifically, a small amount of beryllium is included in one or more layers of a wavelength converting stack. It has been discovered that in fact incorporating beryllium into any layer of the wavelength converting stack can suppress the formation of dark line defects to some degree. In one model, this is because the localized strain around beryllium atoms pins the threading dislocations in a given location and prevents the associated stacking faults from growing horizontally. Not every location within the wavelength converting stack may equally affect the efficiency of the light emitting system. In fact, including Be in the growth of absorber layers or potential wells layer typically results in lower efficiency of the wavelength converting stack. This may be due to any number of reasons, including dark recombination centers associated with the beryllium atoms or impurities in the beryllium source material.

Where beryllium is included in layers outside of the absorbing layers and potential well layers, performance and efficiency does not notably suffer. Therefore, although the present description contemplates including beryllium in any layer of the wavelength converting stack of semiconductor layers 160, it may be preferred that beryllium be added to layers in the stack 160 such as the window layer and not included in the potential well layers or absorbing layers. Referring back to FIG. 1, this means that in one embodiment, it is preferable to add beryllium to the window layer 108. Typically the window layer includes CdMgZnSe with relatively high Mg composition to achieve a high band gap energy. However, as discussed above, this results in an increased tendency to form extended stacking faults and dark-line defects. The window layer may therefore be made up of BeCdMgZnSe to prevent the formation of dark-line defects. Beryllium may also be added to the graded window layer 110 if such a layer is present. In order to avoid performance degradation, if may be preferable to avoid adding beryllium to the potential wells 114 or absorber layers 112 proximate such wells. However, it may be preferable that if there are other layers present in the stack that are not in close proximity to the potential wells, that these layers also contain beryllium. Beryllium may, in a number of embodiments, be added to the layers such as a light filtering element 116, and buffer layers 105, 106. The amount of beryllium added to a given layer may affect the dark-line suppression. A great deal of beryllium is not necessary to be effective at the proscribed task, but a minimum amount is necessary. In one particular embodiment the amount of beryllium in wavelength converting stack layers (outside of absorbing layers and potential well layers) is 3% of the metal cation atoms. This amount may be varied somewhat. For example, in some embodiments the amount of beryllium may vary between about 1% and about 5%, or between about 2% and about 4%, or between about 2.5% and about 3.5%.

Figure 9:
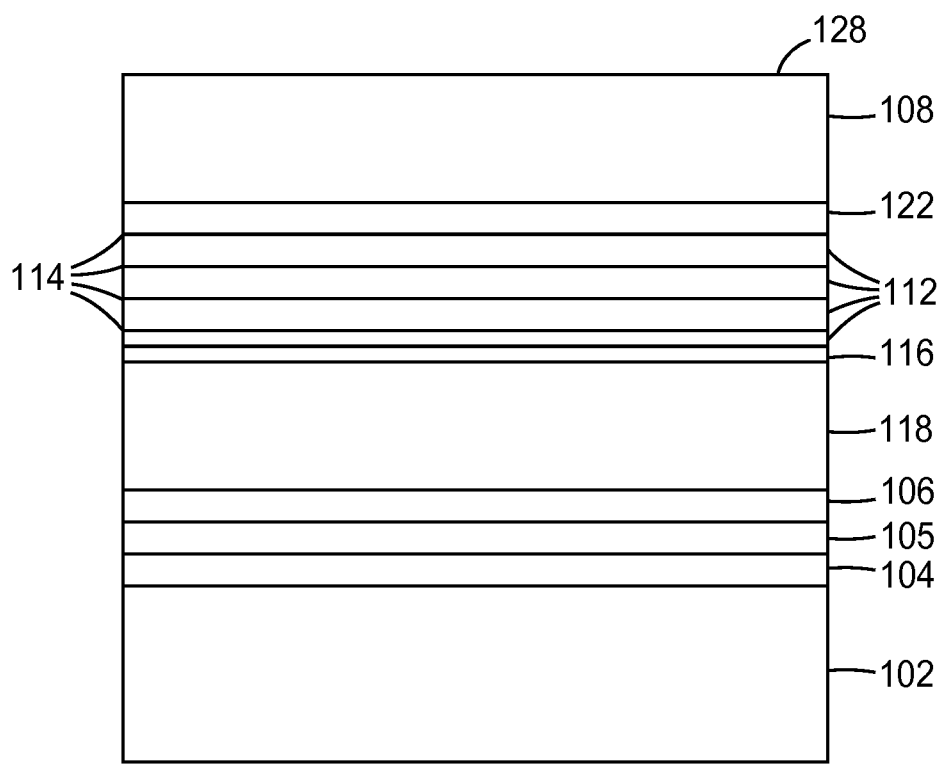
FIG. 9 is a side view of a wavelength-converting stack of semiconductor layers grown on a substrate.

As noted, the wavelength converting stack may also include a spacer. Such a spacer is illustrated in FIG. 9 as element 122. The wavelength converting stack of FIG. 9 shares nearly all of the same elements of those in the stack illustrated in FIG. 1c. such as substrate 102, graded buffer layer 106 and optional buffer layers 104 and 105, light filtering element 118, optional filtering graded layer 116, absorbing layers 112, light converting regions 114, window layer 108 and surface 128. The spacer 122 may be made of a II-VI semiconductor material, and more specifically may be made of CdMgZnSe. The spacer 122 may be inserted between the first absorber layer 112 in the stack or first light converting region 114 and the window layer 108 (in the same position that the optional graded window layer was located in the embodiment illustrated in FIG. 1c). This spacer may serve to further separate the beryllium atoms in the window layer 108 (where the window layer is made up of BeCdMgZnSe) from photo-generated carriers. This may in turn improve the efficiency of the converters. The spacer will desirably have a high magnesium concentration (approximately 50%). Because of this, in order to prevent dark line formation, the spacer should have proper strain and cannot be too thick.

EXAMPLES

Example 1

Figure 6A:
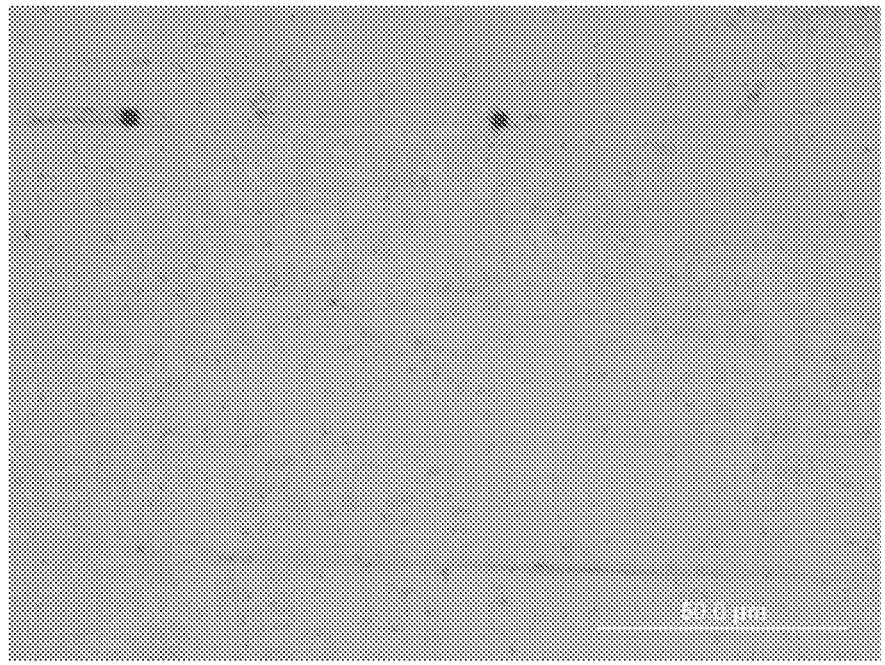
FIGS. 6a-b are photoluminescent microscopy images of a light emitting system before and after aging 24 hours.
Figure 6B:
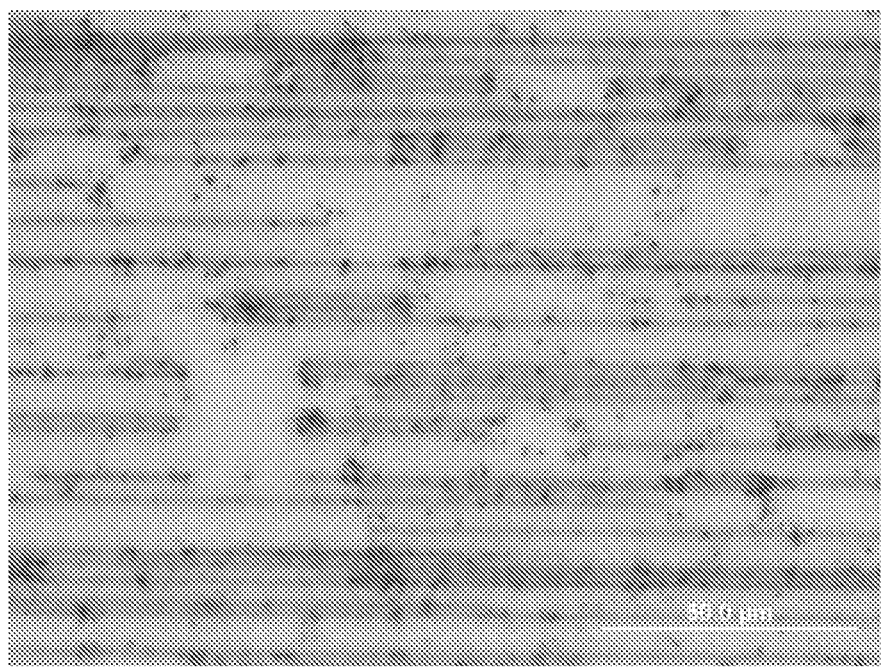

Two wavelength converting stack samples were analyzed to understand the effect of beryllium on dark-line defects. The first sample was given reference number B1746. B1746 was constructed with a layer sequence such as that shown in FIG. 1. In other words, the structure received light form an LED through a window layer. The structure also was made up of alternating potential wells and absorbers, followed by a graded layer, light filtering element, a graded buffer layer and a CdZnSe buffer layer. B1746 had no beryllium anywhere in the wavelength converting stack. The absorbers contained approximately 26% Magnesium and the window layers contained approximately 49% magnesium. All of the layers in B1746 have tensile strain from about 0 to about +200 arc seconds. A photoluminescence image of the wavelength converting stack was taken initially, that is, before any aging. The stack was then subjected to LED light with high blue flux in a temperature environment of between 100° C. and 120° C. A photoluminescent image was taken once again after 24 hours of aging. FIG. 6a illustrates the results before aging, and FIG. 6b illustrates the results after 24 hours of aging. Very few dark lines can be seen from photoluminescent imaging before aging in FIG. 6a. However, many dark-line defects appear after 24 hours of aging. The reliability of B1746 will be poor due to the high density of dark line defects.

Figure 7A:
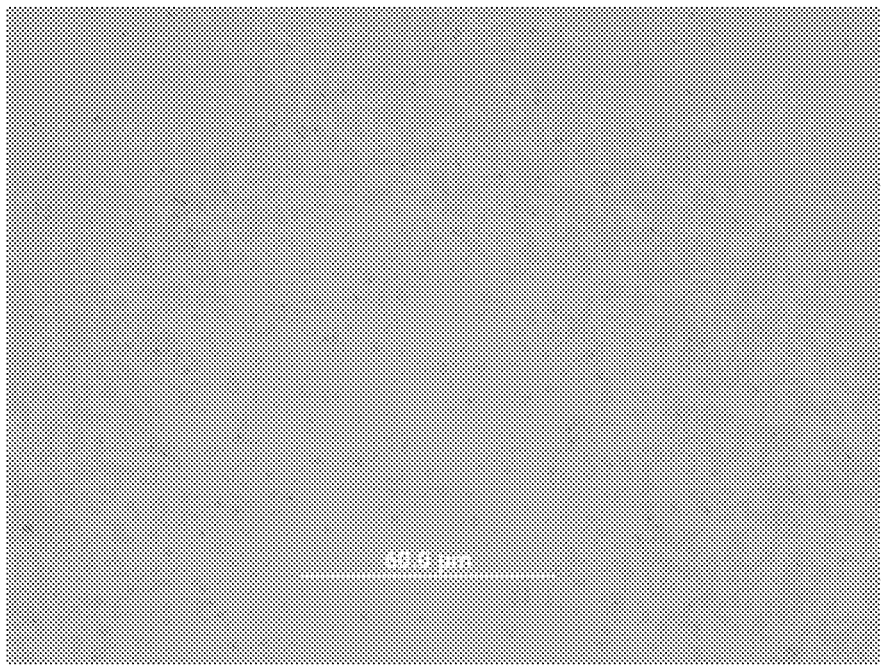
FIGS. 7a-b are photoluminescent microscopy images of a light emitting system before and after aging 300 hours.
Figure 7B:
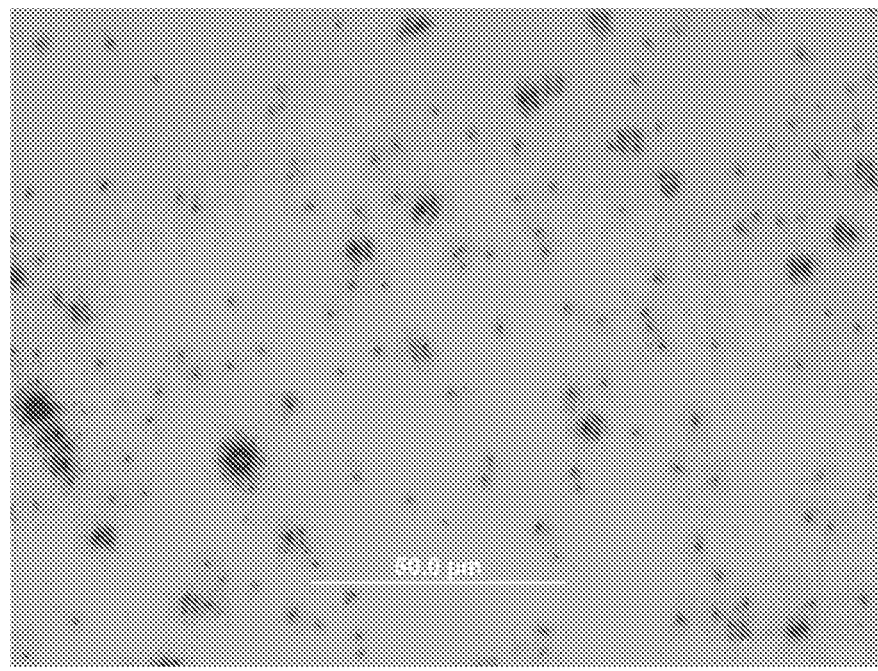

The second sample was given reference number B1740. It had the same functional layer sequence as B1746 with different material composition. Notably, the absorber had approximately 26% magnesium and no beryllium. However, the window composition was 50% magnesium and 3% beryllium. A photoluminescent image of the converter stack was taken before any aging, and is shown in FIG. 7a. No noticeable dark-line defects were present. The stack was then subjected to LED light with high blue flux in a temperature environment of between about 100° C. and 120° C. A second photoluminescent image was taken after 300 hours at these conditions (or 12.5 times the aging time of the first sample). This image is shown in FIG. 7b. It is apparent that even after 300 hours of aging, the system in FIG. 7b still displays no noticeable dark-line defects. Only a sparse distribution of dark spot defects is present, meaning that the total area that is defect-free in sample B1740 after 300 hours is much greater than that of sample B1746 after 24 hours. This is readily apparent by comparing FIGS. 7b and 6b. The 3% beryllium in the window layer thus successfully suppressed dark line defects and increased the reliability and life-time of the light emitting system.

We claim:

1. A wavelength converting stack of semiconductor layers, comprising:
   at least one absorber layer absorbing light at a wavelength $\lambda_1$, but not light at a longer wavelength $\lambda_2$,
   at least one potential well layer converting at least a portion of light of wavelength $\lambda_1$ into light of wavelength $\lambda_2$, and
   a window layer substantially transparent to $\lambda_1$, wherein the window layer is a II-VI semiconductor having a composition of BeCdMgZnSe.

2. The wavelength converting stack of claim 1, wherein the at least one absorber does not include beryllium.

3. The wavelength converting stack of claim 1, wherein the at least one potential well layer does not include beryllium.

4. The wavelength converting stack of claim 1, wherein no potential well in the stack comprises beryllium.

5. The wavelength converting stack of claim 1, wherein the at least one potential well comprises II-VI semiconductor material.

6. The wavelength converting stack of claim 5, where the II-VI semiconductor material comprises an alloy of Cd, Mg, Zn and Se, or an alloy of Cd, Mg, Zn, Se and Te.

7. The wavelength converting stack of claim 1, wherein the window layer is substantially transparent to light at wavelength $\lambda_2$.

8. The wavelength converting stack of claim 1, wherein the window layer substantially blocks free carriers from exiting the stack.

9. The wavelength converting stack of claim 1, wherein the window layer is made up of between about 2.5% and about 3.5% beryllium.

10. A light emitting system comprising the wavelength converting stack of semiconductor layers of claim 1.

11. The wavelength converting stack of claim 1, wherein the window layer comprises a graded window layer.

12. A light emitting system, comprising
   an LED emitting light at a first wavelength; and
   a light converting semiconductor element capable of receiving light of the first wavelength from the LED and converting at least part of the light into light of a second wavelength, wherein the light converting semiconductor element comprises a window layer that is a II-VI semiconductor having a composition of BeCdMgZnSe, wherein the window layer is substantially transparent to the light of the first wavelength.

13. The light emitting system of claim 12, wherein the light converting semiconductor element further comprises potential well layers comprising II-VI material.

14. The light emitting system of claim 12, wherein the LED is comprised of GaN.

15. The light emitting system of claim 12, wherein the light converting semiconductor element further comprises absorbing layers and potential well layers.

16. The light emitting system of claim 15, wherein beryllium is not located in the absorbing layers and potential well layers.

17. The light emitting system of claim 12, wherein the window layer comprises a graded window layer.

* * * * *